United States Patent [19]
Ito

[11] Patent Number: 5,229,638
[45] Date of Patent: Jul. 20, 1993

[54] INTEGRATED CIRCUIT LEAD FRAME HAVING Z-SHAPE STEP PORTION

[75] Inventor: Yuji Ito, Nagano, Japan

[73] Assignee: Seiko Epson Corporation, Tokyo, Japan

[21] Appl. No.: 777,120

[22] Filed: Oct. 16, 1991

[30] Foreign Application Priority Data

Nov. 20, 1990 [JP] Japan .................................. 2-315427
Sep. 26, 1991 [JP] Japan .................................. 3-247319

[51] Int. Cl.$^5$ ...................... H01L 23/48; H01L 23/50
[52] U.S. Cl. ...................................... 257/666; 257/773
[58] Field of Search ........................... 357/70, 74, 68; 257/666, 676, 773

[56] References Cited

U.S. PATENT DOCUMENTS 4,513,355  4/1985  Schroeder et al. ................. 357/74

Primary Examiner—Rolf Hille
Assistant Examiner—S. V. Clark
Attorney, Agent, or Firm—Ladas & Parry

[57] ABSTRACT

Disclosed is an integrated circuit lead frame which comprises: a die-pad; die-pad suspension leads for supporting the die-pad; a number of inner leads provided around the die-pad so as to be separated from the die-pad at a predetermined distance, and connected through wires with electrodes of an integrated circuit fixed onto the die-pad; wherein a step portion having a sharp corner portion is provided in at least one portion of the lead frame. Further disclosed is a method of producing such an integrated circuit lead frame as mentioned above, wherein a portion between one of the die-pad suspension leads and one of the inner leads adjacent to the one die-pad suspension lead is stamped out through two or more steps to thereby form a step portion having a sharp corner portion in a side portion of the one die-pad suspension lead or the one inner lead. Thus, since the step portion is formed through two or more steps, the step portion may have an corner portion which is sharp and which has no shear drop so that it is possible for an image recognition apparatus to recongnize the step portion accurately and rapidly to thereby perform the recognition with no error.

11 Claims, 8 Drawing Sheets

INTEGRATED CIRCUIT LEAD FRAME HAVING Z-SHAPE STEP PORTION

BACKGROUND OF THE INVENTION

1. Field of the Invention

The present invention relates to an integrated circuit lead frame and a method of producing the same, and particularly relates to an integrated circuit lead frame for mounting an integrated circuit chip thereon and a method of producing the same.

2. Description of the Related Art

FIG. 11 is a plan view illustrating an example of a conventional lead frame for mounting an integrated circuit chip thereon. The lead frame is formed by working a thin metal plate. It has a frame 1, defining an opening and outer leads 2 to inner leads 3 through a connection portion called a damper 6 connecting the frame and a substantially square die-pad 8 for mounting an integrated circuit chip thereon centered in the opening of the frame 1 at a predetermined distance from top end portions of the inner leads 3 and supported at its four corners by die-pad suspension leads 9, 9a, 9b and 9c which are connected to the damper 6.

In assembling an integrated circuit using such a lead frame, as shown in FIG. 12, wire bonding is performed so as to connect respective electrodes 11 of an integrated circuit chip 10 fixed on the die-pad 8 to the corresponding inner leads 3 through metal wires 12.

In such a wire bonding process, in order to improve the bonding position accuracy between the respective electrodes 11 of the integrated circuit chip 10 and the corresponding inner leads 3, positional correction is performed on the integrated circuit chip 10 side as well as on the inner leads 3 side before starting wire bonding, bonding positions are decided on the basis of the correction values, and then the wire bonding is carried out.

In this case, for the positional correction on the inner leads 3 side, generally, a desired one inner lead, or two inner leads, for example, 3 and 3m, adjacent to a pair of opposite die-pad suspension leads 9 and 9a respectively as shown in FIG. 11 are used, and correction is made while, at a top end portion 4 of each of the inner leads 3 and 3m, a target, that is, a peripheral shape including a corner portion 7 formed between the top end portion 4 and a side portion 5 thereof as shown in FIG. 12, is recognized by using an image recognition apparatus.

Further, in order to clarify the recognition/correction position on the inner lead 3, another method in which a hole 13 is provided in the inner lead 3 as shown in FIG. 13 has been used. In FIGS. 12 and 13, each of hatched portions 14 and 15 shows an area of a shape image to be stored in the case of using an image recognition apparatus.

Recently, as functions of semiconductor devices increase, a demand for increasing the number of input-/output terminals of an integrated circuit has become high, and a semiconductor device having more than 200 pins has appeared.

In order to respond to such a demand, it has been proposed to form a multi-pin lead frame with the inner leads thereof very small. As a result, the width of the top end portion of each inner lead, which has been 0.3 mm or more, becomes 0.1 mm. Accordingly, the following problem has occurred in performing bonding position correction on the inner lead side.

(1) If the inner leads 3 are made very small, the shapes of the top end portions 4 of the respective inner leads 3 become substantially the same as shown in FIG. 14, so that the respective inner leads 3 have no difference in shape, that is, in shape features, such as a lead width, and an angle formed at a top end corner portion, and so on.

It is therefore difficult to distinguish adjacent inner leads 3, 3a, ..., so that a worker and an image recognition apparatus make an error in recognizing an objective inner lead 3 in the above-mentioned method to thereby erroneously judge that an inner lead, for example 3a, other than the objective inner lead 3 is the objective inner lead to be recognized for the correction. As a result, as shown in FIG. 15, the inner lead 3a is connected not to a corresponding electrode 11b of the integrated circuit chip 10 but to an erroneous electrode 11a. Thus, sometimes, there occurs a case where bonding is carried out with extreme positional displacement.

(2) In addition, it has been difficult to realize the method in which a hole 13 is formed in an objective inner lead 3, which has been described with reference to FIG. 13, since the width of the inner lead 3 is very narrow.

SUMMARY OF THE INVENTION

It is therefore an object of the present invention to solve the above problems.

It is another object of the present invention to provide an integrated circuit lead frame having a shape which can be recognized rapidly and surely in wire bonding and method of producing the same.

The integrated circuit lead frame according to the present invention comprises a step portion having a sharp corner portion and provided in at least one portion of the lead frame.

Further, the integrated circuit lead frame according to the present invention comprises a step portion provided in at least one of die-pad suspension leads or one of inner leads adjacent to the one die-pad suspension lead.

Further, the integrated circuit lead frame according to the present invention comprises a step portion provided in each of opposite ones of die-pad suspension leads or ones of inner leads adjacent to the opposite die-pad suspension leads.

In order to produce the above-mentioned integrated circuit lead frame, a portion between a die-pad suspension lead and an inner lead adjacent thereto is stamped out through two or more steps to thereby form a step portion having a sharp corner portion in a side portion of the die-pad suspension lead or in a side portion of the inner lead.

Further, a portion between a die-pad suspension lead and an inner lead adjacent thereto is stamped out by means of a first punch having a length a little longer than the distance from a top end portion of the inner lead to a step portion to be formed and having a width which agrees with the interval between the die-pad suspension lead and the inner lead adjacent thereto; and the rest portion is stamped out by means of a second punch wider than the first punch to thereby form the step portion.

The shape of a step portion is recognized as an image by an image recognition apparatus, and compared with a reference image and reference positional information stored in the image recognition apparatus, so that displacement quantities $\Delta x$ and $\Delta y$ in the X and Y directions and an inclination quantity $\Delta \theta$ are computed, and bonding position correction of the whole of inner leads is performed on the basis of these quantities.

Further, a portion between a die-pad suspension lead and an inner lead is stamped out through two or more steps, so that it is possible to form a step portion having a corner portion which is sharp and which has no shear drop.

BRIEF DESCRIPTION OF THE DRAWINGS

Other features and advantages of the present invention will be apparent from the following description taken in connection with the accompanying drawings, wherein.

DETAILED DESCRIPTION OF THE PREFERRED EMBODIMENT

An embodiment of the present invention will be described with reference to the drawings.

Figure 1:
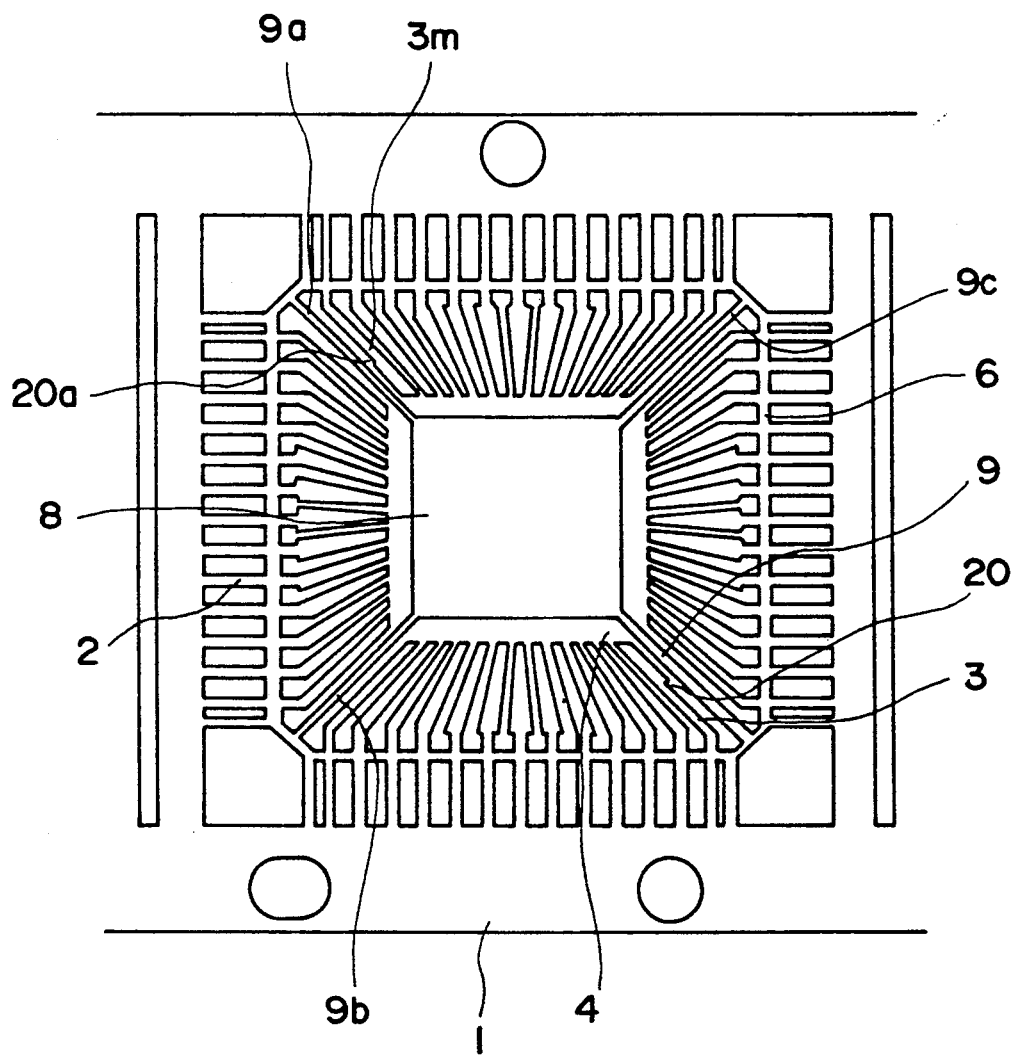
FIG. 1 is a plan view illustrating an embodiment of the integrated circuit lead frame according to the present invention.
Figure 2:
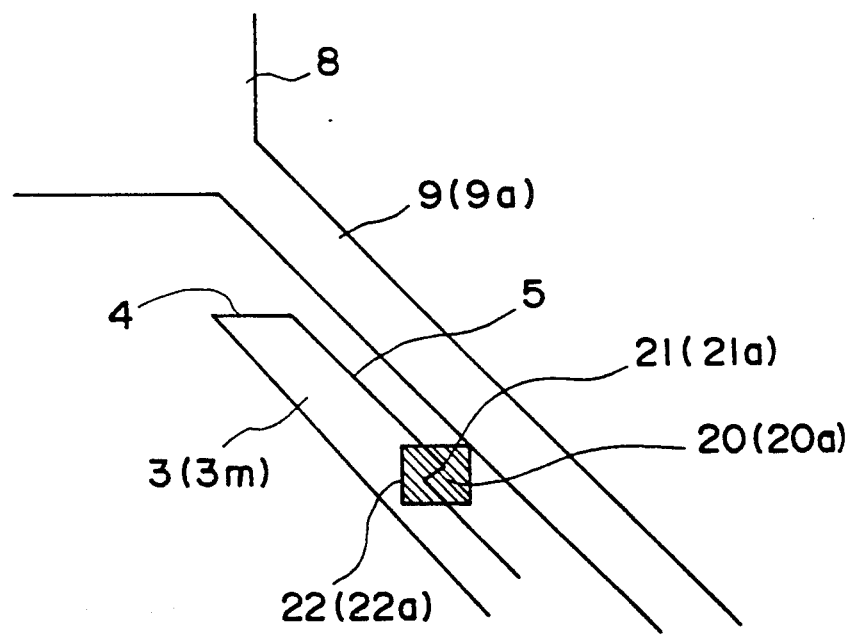
FIG. 2 is an enlarged view illustrating a main portion of FIG. 1.
Figure 11:
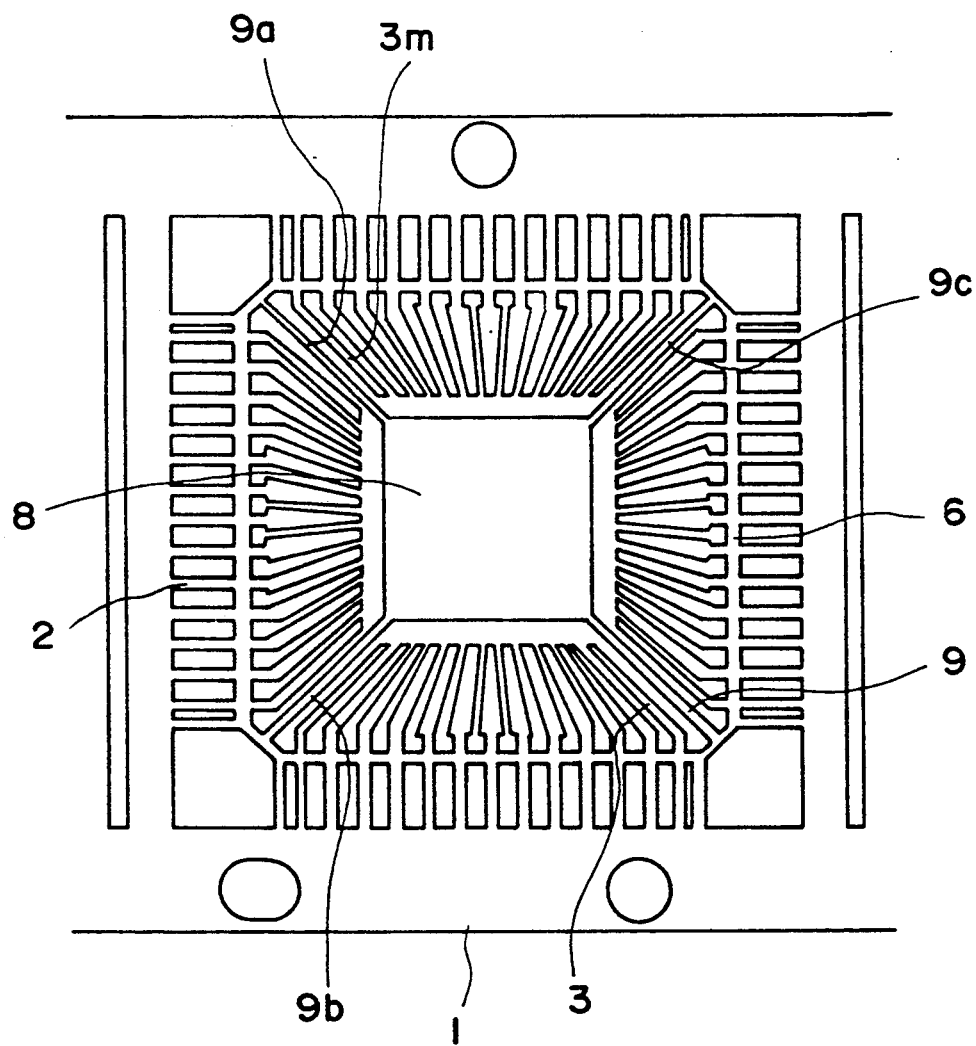
FIG. 11 is a plan view illustrating an example of a conventional integrated circuit lead frame.
Figure 12:
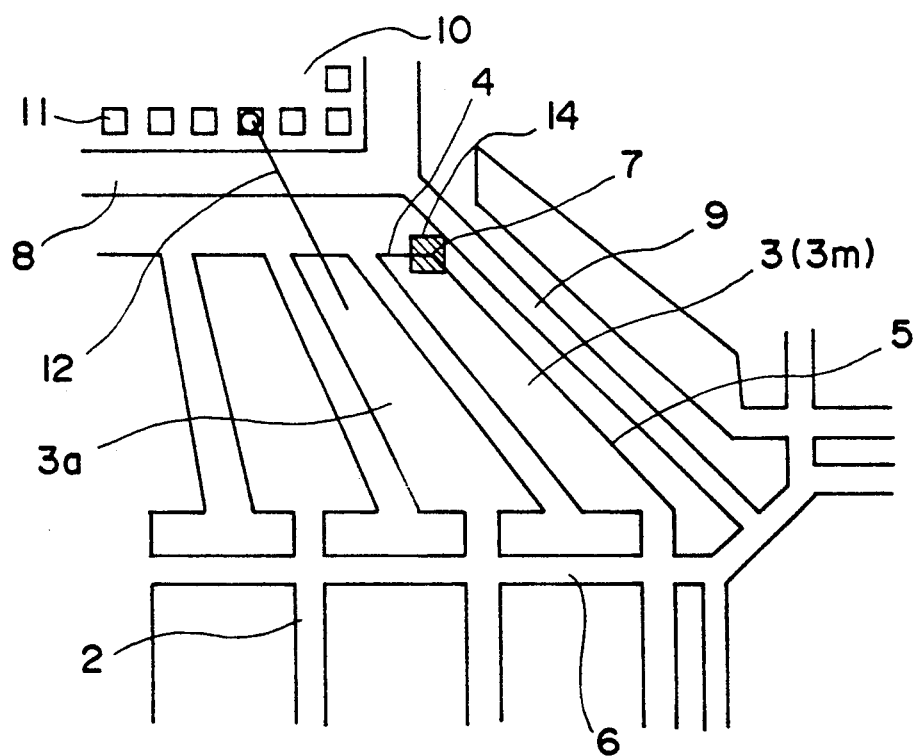
FIG. 12 is a view for explaining the operation of an example of the main portion of FIG. 11.
Figure 13:
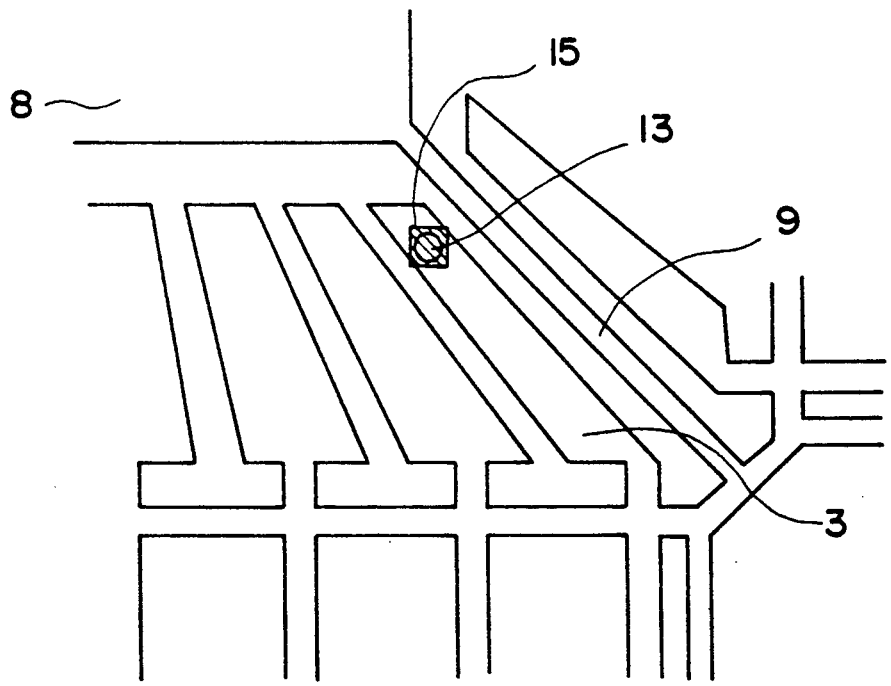
FIG. 13 is an enlarged view illustrating another example of the main portion of FIG. 11.
Figure 14:
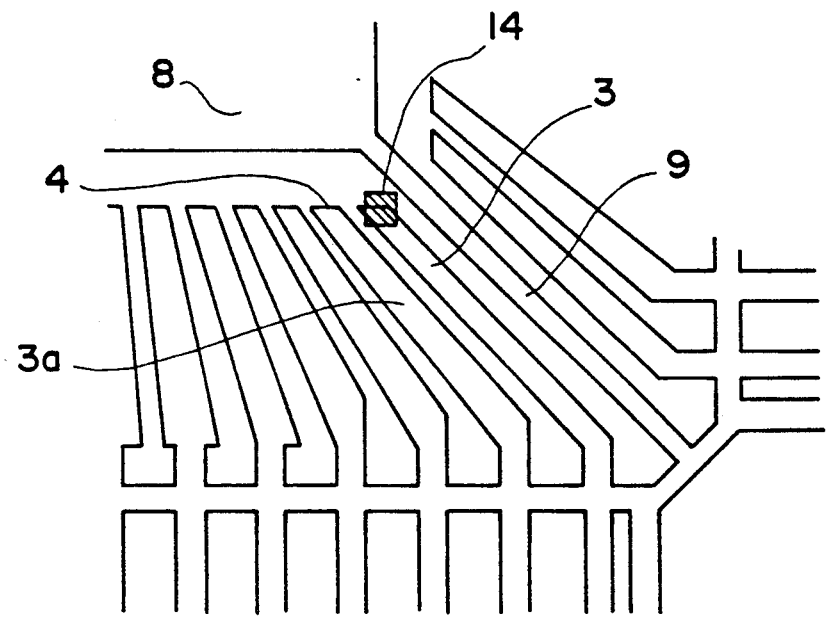
FIG. 14 is an enlarged view illustrating a main portion of a conventional integrated circuit lead frame have a large number of pins.
Figure 15:
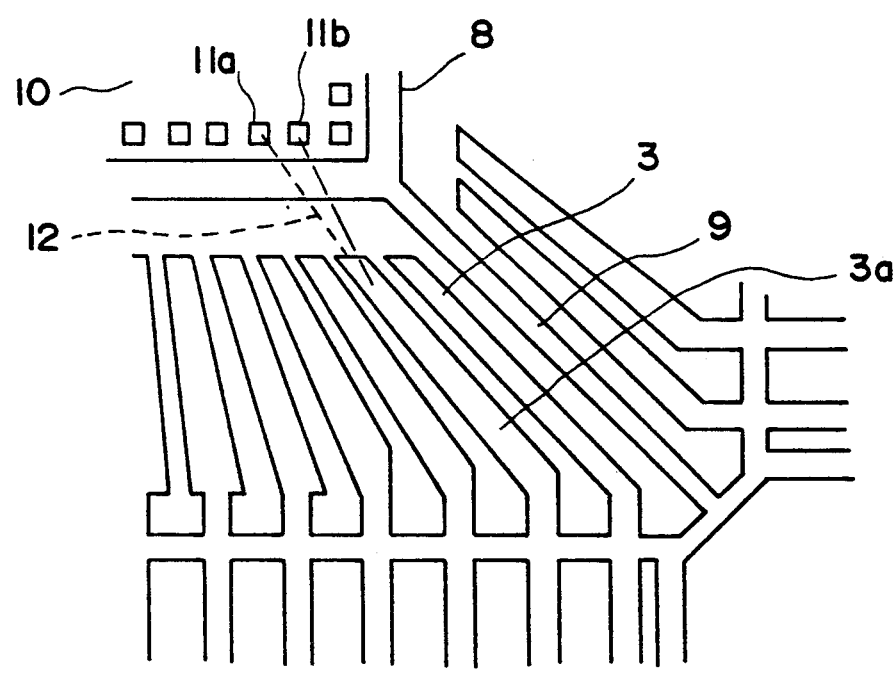
FIG. 15 is a view for explaining the operation of FIG. 14.

FIG. 1 is a plan view if an embodiment of the present invention, and FIG. 2 is an enlarged view of a main portion of FIG. 1. Parts the same as those in the conventional example described with respect to FIG. 11 are referenced correspondingly, and will not be described here.

In this embodiment, each of the pair of inner leads 3 and 3m adjacent to the pair of diagonally opposite die-pad suspension leads 9 and 9a for suspending the die-pad 8 are made to have a single substantially Z-shaped step portion 20 and 20a respectively in a side edge facing the correspondingly adjacent die-pad suspension leads 9 and 9a between the respective top end portions 4 and the damper 6.

Figure 3:
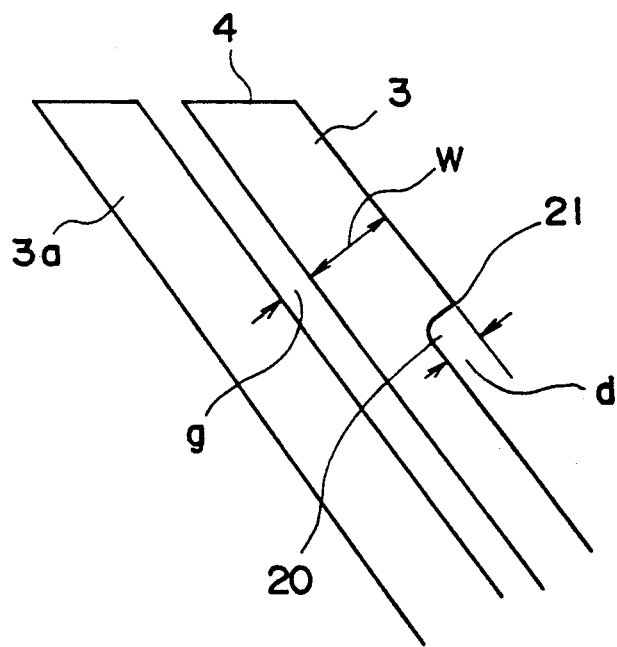
FIG. 3 is a detailed explanatory view of FIG. 2.

According to this embodiment, as shown in FIG. 3, the inner lead 3 having a thickness of 0.15 mm, a top end portion width W of 0.25 mm and a distance g to the adjacent inner lead 3a of 0.1 mm was made to have a step portion 20(20a) of a depth d of 0.1 mm, so that the corner portion 21 (21a) of the inner lead 3 was made sharp. The shape of this step portion 20 (20a) was recognized as an image (a hatched portion 22 (22a) shows an area having a shape to be stored as an image), and compared with a reference image and reference position information stored in an image recognition apparatus to thereby compute positional displacement quantities $\Delta x$ and $\Delta y$ in the X and Y directions and an inclination quantity $\Delta \theta$. Thus, bonding position correction was performed with respect to the whole of inner leads on the basis of the above quantities, and a good result could be obtained.

In the above description, although the two inner leads 3 and 3m which were adjacent to the die-pad suspension leads 9 and 9a and which were opposite to each other in the diagonal direction of the die-pad 8 were made to have the step portions 20 and 20a respectively in the die-pad suspension leads 9 and 9a to thereby perform positioning of the inner leads 3 by using an image recognition apparatus, the inner leads which have the step portions 20 and 20a are not limited to the inner leads 3 and 3m which have been described above, but such step portions may be formed in any other inner leads. Further, the step portions 20 and 20a may be formed in the inner leads on their outer side far away from the respective die-pad suspension leads 9 and 9a.

Further, the provision of such a step portion 20 is not limited to two opposite inner leads, but such a step portion 20 may be provided in one or in each of three or more inner leads. In the case of providing such a step portion 20 in each of two or more inner leads, it is preferable to provide the step portion 20 in inner leads which are opposite to each other if possible.

Furthermore, the provision of such a step portion is not limited to the inner lead 3, but such a step portion 20 may be provided in another position, for example, in the outer lead 2, in the damper 6, in the die-pad 8, in the die-pad suspension leads 9 to 9c, or the like. In short, it goes well if such a step portion 20 is provided on the lead frame 1.

As the method of producing a lead frame, there are two well-known methods, an etching method and stamping method. However, lead frames produced by the stamping method have been used broadly because of low cost, and the lead frame having a step portion according to the present invention can be produced also by this stamping method.

Figure 4:
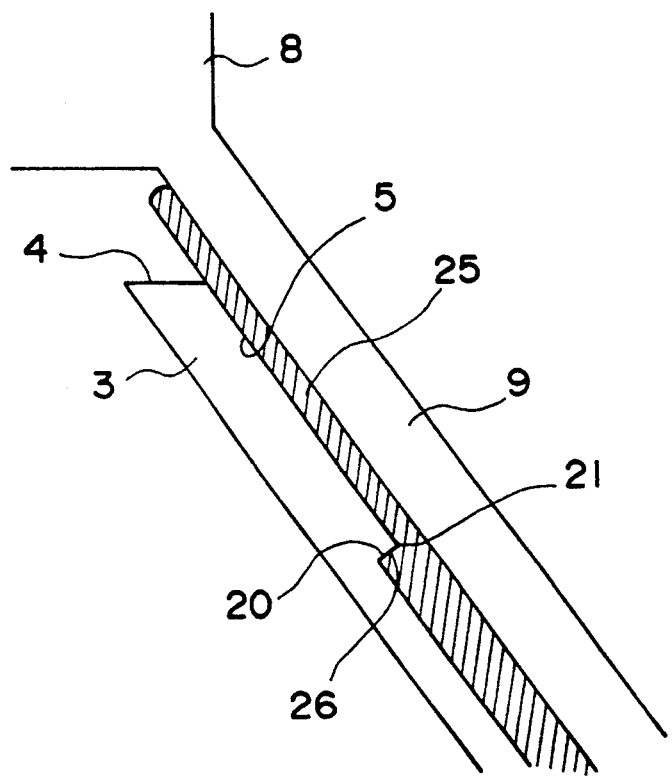
FIG. 4 is an explanatory view illustrating an example of a method of producing a step portion according to the present invention.
Figure 5:
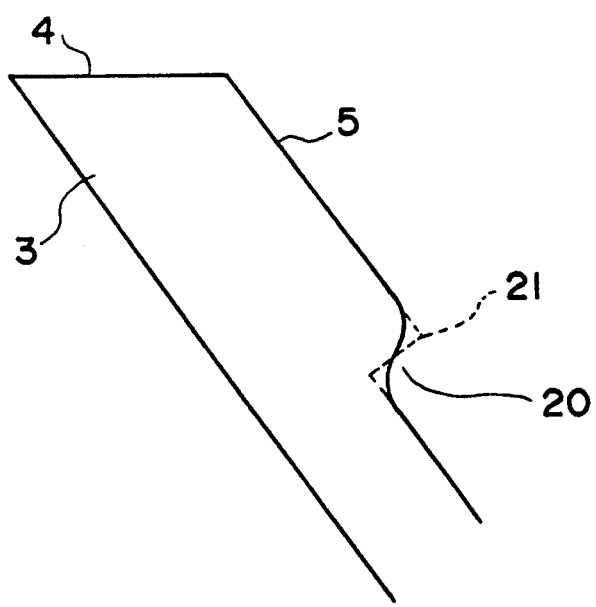
FIG. 5 is an enlarged view illustrating a main portion of FIG. 4.

FIG. 4 shows an example of the method of producing a lead frame, according to the present invention, particularly its step portion 20, according to the present invention. In this example, a portion between an inner lead 32 and a die-pad suspension lead 9 is stamped out, through one step, by means of a punch 25 having a step portion 26.

However, if stamping is carried out through one step by means of such a signal punch 25, an corner portion 21 of the step portion 20 becomes accurate so that the shape thereof is not stable. This is caused by abrasion of the punch 25 and a clearance between the punch 25 and a die (not-shown). In addition, in stamping by means of the punch 25, stress causes unstable shear drop or roll over at the corner portion 21 and edge portions near the corner portion 21.

Such an arcuate shape or shear drop produced at the corner portion 21 of the step portion 20 is apt to be judged different from a reference image or reference positional information stored in an image recognition apparatus, so that erroneous recognition or stoppage of operation of the apparatus may occur easily. It is therefore necessary to make the step portion 20 have the corner portion 21 which is sharp and has no shear drop.

FIGS. 6 to 10 show various embodiments of the method of producing a lead frame, particularly the step portion 20 formed in the inner lead 3, according to the present invention.

Figure 6:
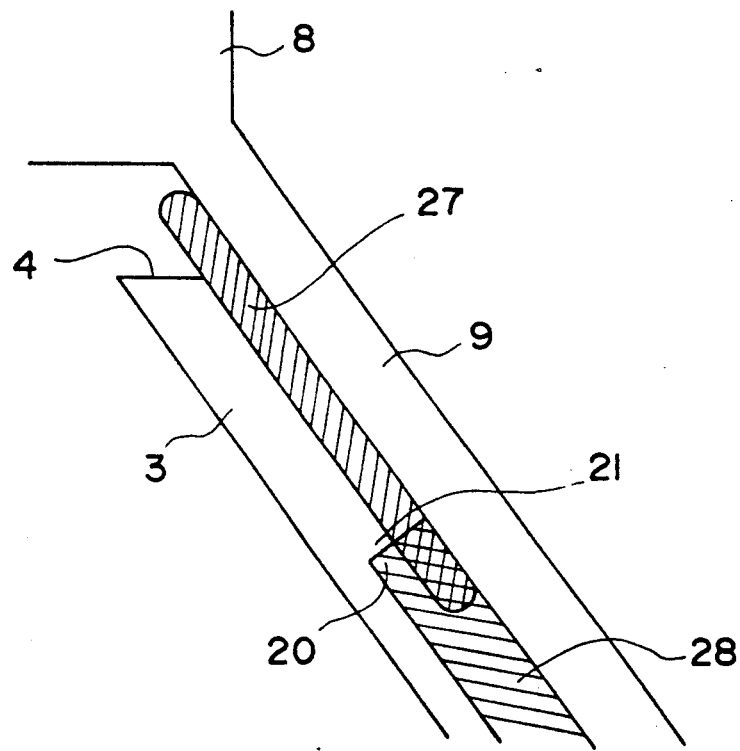
FIG. 6 is a view for explaining a first embodiment of the method of producing a step portion according to the present invention.

In the embodiment in FIG. 6, first the portion between the inner lead 3 and the die-pad suspension lead 9 was stamped out on the die-pad 8 side by means of a first punch 27 having a length longer than the distance from the top end portion 4 of the inner lead 3 to the step portion 20 and having a width which agrees with the interval between the inner lead 3 and the die-pad suspension lead 9. Next, the portion between the inner lead 3 and the die-pad suspension lead 9 was stamped out on the damper 6 side by means of a second punch 28 wider than the first punch 27. Thus, the step portion 20 was formed through the two steps by means of the two kinds of punches 27 and 28.

Therefore, it was possible to obtain the step portion 20 having the corner portion 21 having a sharp and stable shape, and it was possible to reduce generator of shear drop, so that reproducibility could be improved conspicuously. While the bonding accuracy of the metal wire 12 with the inner lead 3 was ±25 μm in the case of the lead frames produced by the method of producing in FIG. 4, the bonding accuracy was ±12 μm in the lead frames produced by this embodiment. Thus, the bonding accuracy could be improved conspicuously.

Figure 7:
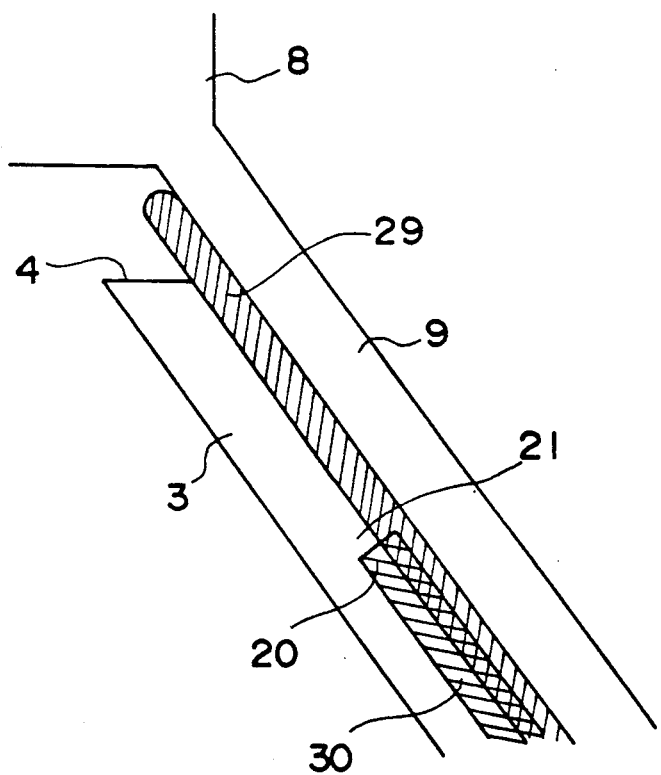
FIG. 7 is a view for explanation a second embodiment of the method of producing a step portion according to the present invention.

In the embodiment in FIG. 7, first the portion between the inner lead 3 and the die-pad suspension lead 9 was stamped out by means of a third punch 29 having a width which agrees with the interval between the leads 3 and 9, and next the portion between the step portion 20 and the damper 6 was stamped out by means of a fourth punch 30 to thereby form the step portion 20 having the corner portion 21 which is sharp and which has no shear drop.

Figure 8:
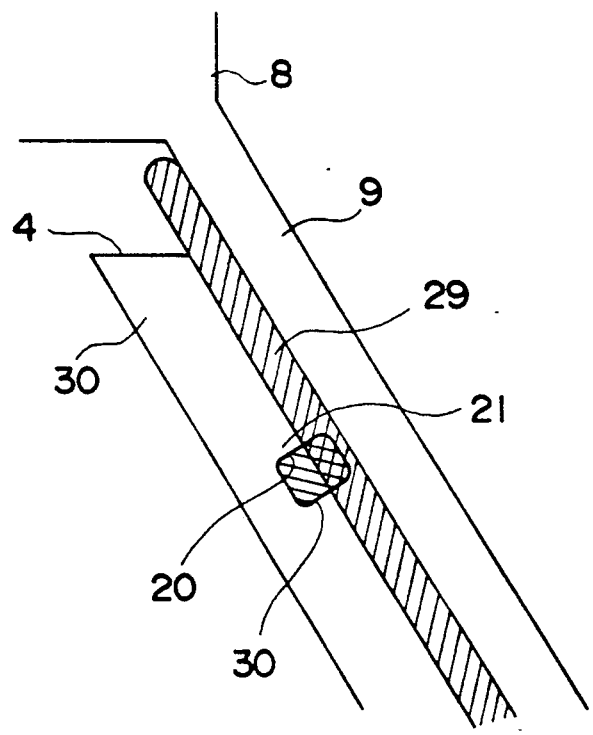
FIG. 8 is a view for explaining a third embodiment of the method of producing a step portion according to the present invention.

In the embodiment if FIG. 8, in the same manner as the case of FIG. 7, first the portion between the inner lead 3 and the die-pad suspension lead 9 was stamped out by means of the third punch 29, and next the portion between the top end portion 4 of the inner lead 3 and the damper 6 was stamped out by means of a fifth punch 31 to thereby form the step portion 20 having a concave portion.

Figures 9, 10:
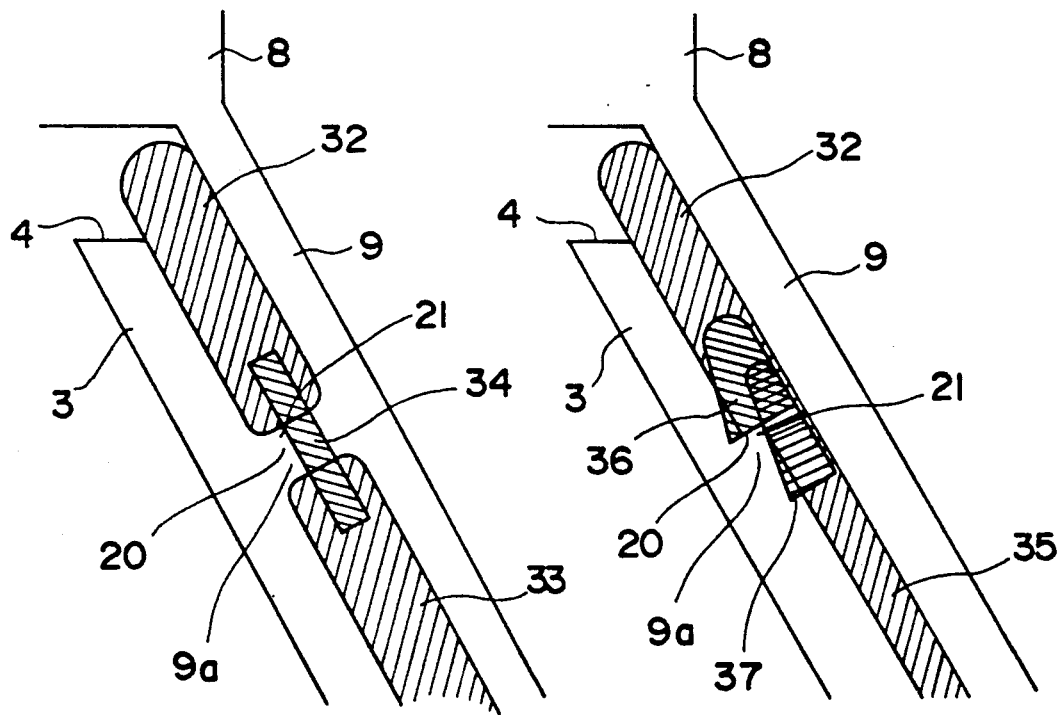
FIG. 9 is a view for explaining a fourth embodiment of the method of producing a step portion according to the present invention.
FIG. 10 is a view for explaining a fifth embodiment of the method of producing a step portion according to the present invention.

In the embodiment in FIG. 9, the portion between the inner lead 3 and the die-pad suspension lead 9 was stamped out by means of slightly wider sixth and seventh punches 32 and 33 to leave a bridge portion 9a connecting the inner lead 3 with the die-pad suspension lead 9, and next a substantially center portion of the bridge portion 9a is stamped out by means of an eighth punch 34 narrower than the sixth and seventh punches 32 and 33 to thereby form the step portion 20 projecting on the die-pad suspension lead 9 side.

At this time, stamping may be made by using a single punch having a concave portion in its intermediate portion, in place of using the two sixth and seventh punches 32 and 33 to thereby form the bridge portion 9a.

In the embodiment in FIG. 10, the portion between the inner lead 3 and the die-pad suspension lead 9 was stamped out by means of the sixth punch 32 as described in FIG. 9 and a ninth punch 35 having a width which agrees with the interval between the leads 3 and 9 while leaving the bridge portion 9a, and next the bridge portion 9a was stamped out on the die-pad 8 side by means of a substantially trapezoidal tenth punch 36. Last the rest portion of the bridge portion 9a is stamped out by means of a substantially trapezoidal eleventh punch 37 smaller than the tenth punch 36 to thereby form the step portion 20 having the arcuate corner portion 21.

Although the embodiments of the method of producing a step portion of a lead frame according to the present invention have been described, the present invention is not limited to those embodiments. In short, it goes well if a step portion having a corner which is sharp and which has no shear drop can be formed by stamping through two or more steps by using two or more punches.

As is apparent from the above description, according to the present invention, a step portion having a sharp corner portion is provided in a lead frame, so that an image recognition apparatus can accurately recognize the shape of a portion to be bonded and perform positional correction in bonding a lead frame having a number of pins. It is therefore possible to prevent generation of faults such as a large positional displacement in wire bonding, and at the same time it is possible to shorten recognition time by a worker and a bonding device, that is, the time for producting a lead frame, so that it is possible to improve the working efficiency.

In addition, since a step portion is produced through two or more steps, it is possible to form a step portion having a corner portion which is sharp and which has no shear drop, and it is therefore possible for an image recognition apparatus to recognize the step portion accurately and rapidly, so that the recognition can be made in no error.

What is claimed is:

1. An integrated circuit lead frame comprising:
    a frame defining an opening;
    a die-pad in said opening for receiving an integrated circuit;
    die-pad suspension leads for supporting said die-pad from said frame;
    a number of inner leads projecting from said frame toward said die-pad so as to have respective top ends separated from said die-pad at a predetermined distance for connection through wires with electrodes of the integrated circuit on said die-pad, whereby some of said inner leads are adjacent to said die-pad suspension leads; and
    step portion means having a single Z shape defining a single sharp corner in at least one of said frame, die-pad, die-pad suspension leads, and inner leads for alignment with the integrated circuit.

2. The integrated circuit lead frame according to claim 1, in which said step portion means is in at least one of said die-pad suspension leads and one of said inner leads adjacent to one of said die-pad suspension leads.

3. The integrated circuit lead frame according to claim 1, in which said step portion means is provided only in two of opposite ones of one of said die-pad suspension leads or ones of said inner leads adjacent to said die-pad suspension leads.

4. An integrated circuit lead frame comprising:
   a frame defining an opening;
   a die-pad in said opening for receiving an integrated circuit;
   die-pad suspension leads for supporting said die-pad from said frame;
   a number of inner leads projecting from said frame toward said die-pad so as to have respective top ends separated from said die-pad at a predetermined distance for connection through wires with electrodes of the integrated circuit on said die-pad, whereby some of said inner leads are adjacent to said die-pad suspension leads; and
   step portion means having a Z shape defining a sharp corner in a side edge at least one of said frame, die-pad, die-pad suspension leads, and inner leads for alignment with the integrated circuit.

5. The integrated circuit lead frame according to claim 4, in which said step portion means is provided only in two of opposite ones of one of said die-pad suspension leads or ones of said inner leads adjacent to said die-pad suspension leads.

6. The integrated circuit lead frame according to claim 4, wherein said step portion means are at said top end of at least one of said inner lead frames.

7. The integrated circuit lead frame according to claim 6, in which said step portion means is provided only in two of opposite ones of one of said die-pad suspension leads or ones of said inner leads adjacent to said die-pad suspension leads.

8. The integrated circuit lead frame according to claim 4, wherein each of said step portion means comprises a single Z shape defining a single sharp corner.

9. The integrated circuit lead frame according to claim 5, wherein each of said step portion means comprises a single Z shape defining a single sharp corner.

10. The integrated circuit lead frame according to claim 6, wherein each of said step portion means comprises a single Z shape defining a single sharp corner.

11. The integrated circuit lead frame according to claim 7, wherein each of said step portion means comprises a single Z shape defining a single sharp corner.

* * * * *